United States Patent
Teplechuk

(10) Patent No.: US 9,509,300 B2
(45) Date of Patent: Nov. 29, 2016

(54) ANTI-SHOOT-THROUGH AUTOMATIC MULTIPLE FEEDBACK GATE DRIVE CONTROL CIRCUIT

(71) Applicant: Dialog Semiconductor GmbH, Kirchheim/Teck-Nabern (DE)

(72) Inventor: Mykhaylo Teplechuk, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 26 days.

(21) Appl. No.: 14/274,881

(22) Filed: May 12, 2014

(65) Prior Publication Data

US 2014/0347102 A1 Nov. 27, 2014

Related U.S. Application Data

(60) Provisional application No. 61/827,352, filed on May 24, 2013.

(51) Int. Cl.
| | |
|---|---|
| *H03K 3/00* | (2006.01) |
| *H03K 17/16* | (2006.01) |
| *H03K 5/1252* | (2006.01) |
| *H03K 5/151* | (2006.01) |
| *H03K 17/687* | (2006.01) |

(52) U.S. Cl.
CPC .......... *H03K 17/162* (2013.01); *H03K 5/1252* (2013.01); *H03K 5/1515* (2013.01); *H03K 17/6872* (2013.01)

(58) Field of Classification Search
USPC ........................................................ 327/112
See application file for complete search history.

(56) References Cited

U.S. PATENT DOCUMENTS 4,989,127 A 1/1991 Wegener
5,854,560 A * 12/1998 Chow .............................. 326/27
(Continued)

FOREIGN PATENT DOCUMENTS

| DE | 101 47882 | 4/2003 |
|---|---|---|
| EP | 0 463 854 | 1/1992 |
| JP | 02096422 | 4/1990 |

OTHER PUBLICATIONS

European Search Report 14368023.9-1805 Mailed: Oct. 14, 2014.
(Continued)

*Primary Examiner* — Lincoln Donovan
*Assistant Examiner* — Patrick Chen
(74) *Attorney, Agent, or Firm* — Saile Ackerman LLC; Stephen B. Ackerman

(57) ABSTRACT

Automatic and robust anti-shoot-through glitch-free operation of half-bridge control pre-driver and power stage circuits have been achieved by using multiple feedback control signals. These feedback signals are taken both from the gates of power devices on high side and low sides and from the gates of one or more devices on both high side and low side that enable power device ON state. No duty cycle limitation is required of the input signal. The control logic uses NAND/NOR RS latches. The solution disclosed can readily be scaled to higher order of feedback loops providing even greater level of robustness.

11 Claims, 9 Drawing Sheets

(56) References Cited

U.S. PATENT DOCUMENTS

| | | |
|---|---|---|
| 7,068,486 B2 | 6/2006 | Feldtkeller |
| 7,208,984 B1 | 4/2007 | Petrofsky |
| 7,265,591 B1 * | 9/2007 | Petrofsky ................ 327/108 |
| 7,323,912 B2 | 1/2008 | Nielsen |
| 2006/0001459 A1 | 1/2006 | Audy |
| 2011/0316585 A1 * | 12/2011 | Lee et al. ................ 326/52 |
| 2012/0032714 A1 * | 2/2012 | Shimazaki et al. .......... 327/109 |
| 2012/0287545 A1 | 11/2012 | Tran et al. |

OTHER PUBLICATIONS

European Search Report, Application Number: 14 368 023.9-1805, Applicant: Dialog Semiconductor GmbH, Mail date: Aug. 17, 2016, 8 pgs.

* cited by examiner dd
ANTI-SHOOT-THROUGH AUTOMATIC MULTIPLE FEEDBACK GATE DRIVE CONTROL CIRCUIT This application claims benefit of U.S. Provisional application 61/827,352, filed on May 24, 2013, which is assigned to a common assignee, and is herein incorporated by reference in its entirety.

BACKGROUND

Technical Field

The present document relates to electronic circuits. In particular, the present document relates to gate drive control circuits, method and apparatus in the field of driver circuits preventing cross-conduction between power devices connected in series between power rails, as of e.g. half-bridges.

Background

Series connected power devices between two power rails are used in many applications: switching regulators, Class-D amplifiers, motor drivers etc. Such series connection of power devices/transistors is often referred to as half-bridge configuration.

Power transistors of a half-bridge are respectively driven by two high/low side pre-driver circuits. The pre-driver circuits are typically connected to the control logic circuit that guarantees that each output power device (high or low side) is enabled/switched-on only when the other power device is in guaranteed switched-off state. Time between switching-off one power device and switching-on the other power device is called "dead-time". Prior art driver and control circuit have commonly a number of limitations that not always guarantee glitch-free and robust operation. In the presence of slow rise/fall edges on the gates of power devices and large propagation delays of pre-driver circuits typical prior art control circuit may miss-trigger one or both pre-driver circuits. Pre-driver miss-triggering may potentially result in destruction of one or both pre-driver circuits.

Conventional prior art gate drive control circuit can come in a situation when the pre-driver propagation delay(rise/fall time of pre-driver, dead-time and due to layout parasitics, level-shifting etc.) and delay of sense feedback loop delay approaches pulse width of incoming modulating signals (PWM) and hence a glitch (double pulse) can be generated.

Solutions are desired to avoid the drawbacks mentioned above.

SUMMARY

A principal object of the present disclosure is to achieve an automatic and robust anti-shoot-through and glitch-free operation of half-bridge control pre-driver and power stage circuits.

A further object of the disclosure is that no duty cycle limitation of the input signal is required.

A further object of the disclosure is to achieve half-bridge control pre-driver and power stage circuits which are not sensitive to device layout parasitics.

A further object of the disclosure is to achieve half-bridge control pre-driver and power stage circuits which are characterized by ease of implementation.

A further object of the disclosure is to utilize multiple feedback control signals which are taken both from gates of power devices and from a gate of a device that enables power device ON state.

A further object of the disclosure is achieve half-bridge control pre-driver and power stage circuits which can readily be scaled to multiple feedback loops providing even greater level of robustness.

A further object of the disclosure is to utilize NAND/NOR RS latches, or other types of latches, for control logic.

In accordance with the objects of the disclosure a method to achieve an automatic and robust anti-shoot-through glitch-free operation of half-bridge control pre-driver and power stage circuits has been disclosed. The method disclosed, the method comprises the steps of: (1) providing a half-bridge control pre-driver and power stage circuit having a high-side branch and a low-side branch, wherein each branch comprises a power transistor, n pre-drivers, connected in series, driving the power transistor of the respective branch, and a number of logic control blocks, connected in series, controlling the n pre-drivers, wherein the number of logic control blocks is equal 2 or higher, wherein n is an integer number equal or higher than 1 and the number of logic control blocks is equal or less than the number n, and (2) using feedback from the gate of each power transistor and from gates of the pre-drivers of each of both high side and low side, wherein each feedback is input to an assigned dedicated logic control block enabling ON/OFF state of each power transistor via the n pre-drivers in order to prevent cross-conduction between the power transistor.

In accordance to the objects of the disclosure a system capable of an automatic and robust anti-shoot-through glitch-free operation of half-bridge control pre-driver and power stage circuits has been disclosed. The system disclosed firstly comprises: a high-side branch and a low-side branch, each branch comprising: a power transistor having a gate controlled by n pre-drivers connected in series, wherein n is an integer number equal or higher than 1, n pre-drivers driving the power transistor of the correspondent branch, and a number of logic control blocks connected in series enabling ON/OFF state of the high side power transistor of the correspondent branch via the n pre-drivers of the correspondent branch. Furthermore is has to be noted that each logic control block of the high side of the system disclosed is configured to receive a dedicated feedback signal from a respective gate of the power transistor of the low side or of a dedicated pre-driver of the low side and is capable of enabling ON/OFF state of the high side power transistor via the n pre-drivers of the high side and that each of the logic control blocks of the low side is configured to receive a correspondent feedback signal from a respective gate of the power transistor of the high side or of a dedicated pre-driver of the high side and is capable of enabling ON/OFF state of the low side power transistor via the n pre-drivers of the low side in order to prevent cross-conduction between both power transistors of the low side and of the high side.

In accordance to the objects of the disclosure a system capable of an automatic and robust anti-shoot-through glitch-free operation of half-bridge control pre-driver and power stage circuits has been disclosed. The system disclosed firstly comprises: a high-side branch and a low-side branch, each branch comprising: a power transistor having a gate controlled by n pre-drivers connected in series, wherein n is an integer number equal or higher than 1, n pre-drivers driving the power transistor of the correspondent branch, and a number of logic control blocks connected in series enabling ON/OFF state of the high side power transistor of the correspondent branch via the n pre-drivers of the correspondent branch, wherein the number of logic control block is less than the number n of the pre-drivers and the number of logic control blocks is equal or higher than two. Furthermore is has to be noted that each logic control block of the high side of the system disclosed is configured to receive a dedicated feedback signal from a respective gate of the power transistor of the low side or of a dedicated pre-driver of the low side and is capable of enabling ON/OFF state of the high side power transistor via the n pre-drivers of the high side and that each of the logic control blocks of the low side is configured to receive a correspondent feedback signal from a respective gate of the power transistor of the high side or of a dedicated pre-driver of the high side and is capable of enabling ON/OFF state of the low side power transistor via the n pre-drivers of the low side in order to prevent cross-conduction between both power transistors of the low side and of the high side.

SHORT DESCRIPTION OF THE FIGURES

The invention is explained below in an exemplary manner with reference to the accompanying drawings, wherein FIG. 1a shows a proposed simplified circuit block diagram of multiple feedback control gate drive by feedback loops from the gates of the power transistors and from a gate of an output transistor of the pre-drivers of each high or low side, which are each driving a respective power transistor.

FIG. 1b shows a proposed simplified circuit block diagram of multiple feedback control gate drive by feedback loops from the drains of the power transistors and from a gate of an output transistor of the pre-drivers of each high or low side, which are each driving a respective power transistor.

FIG. 2 prior art shows simulation results of a typical prior art circuit showing typical glitches.

FIG. 3 shows simulation results of the proposed circuit from FIG. 1a.

Figure 5A:
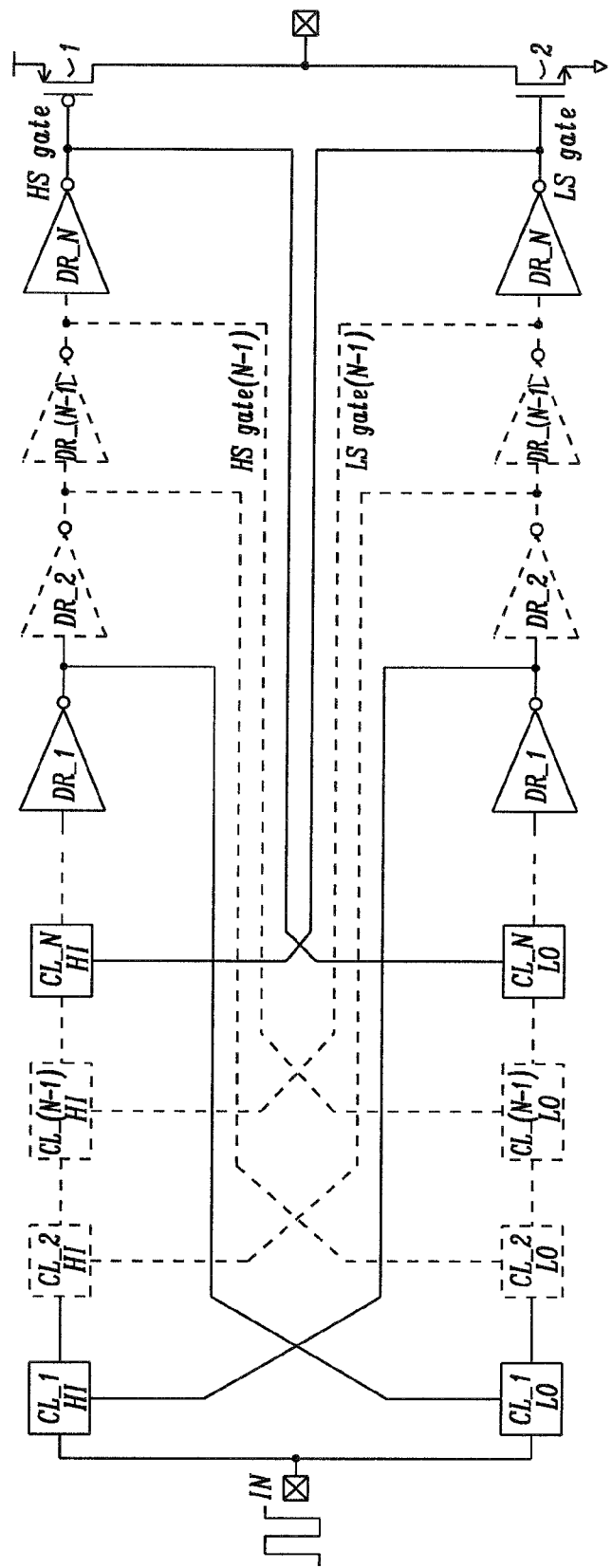

FIG. 5a illustrates the general principle of the disclosure showing cascading of multi-feedback control logic loops, high and low side respectively, (where CL_1 ... N—control logic 1 to N, DR_1 ... N—Driver logic 1 to N) and shows alternative connections between the gates or the drains of the high side power transistor or respective low side power transistor to the correspondent control logic blocks CL_N HI or LO, wherein the feedback loops are provided from each output of the pre-drivers.

Figure 5B:
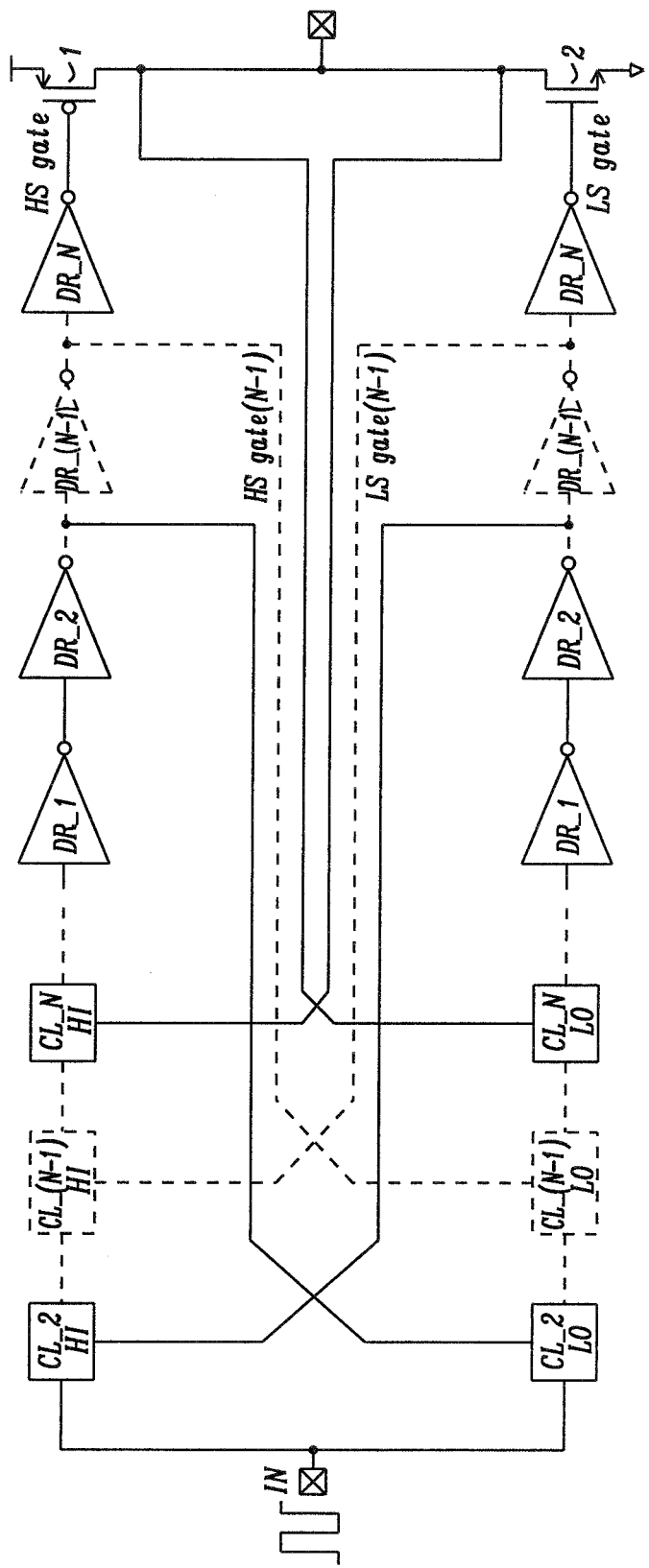

FIG. 5b illustrates the general principle of the disclosure showing cascading of multi-feedback control logic loops, high and low side respectively, (where CL_1 ... N—control logic 1 to N, DR_1 ... N—Driver logic 1 to N) and shows an alternative exemplary implementation wherein the number of control blocks is lower than the number n of pre-drivers, e.g. the control blocks controlled by pre-drivers DR_1 have been removed, wherein the feedback loops are provided from each output of the pre-drivers except the outputs of the pre-drivers driving directly the power transistors are replaced by the drains of the power transistors.

Figure 6:
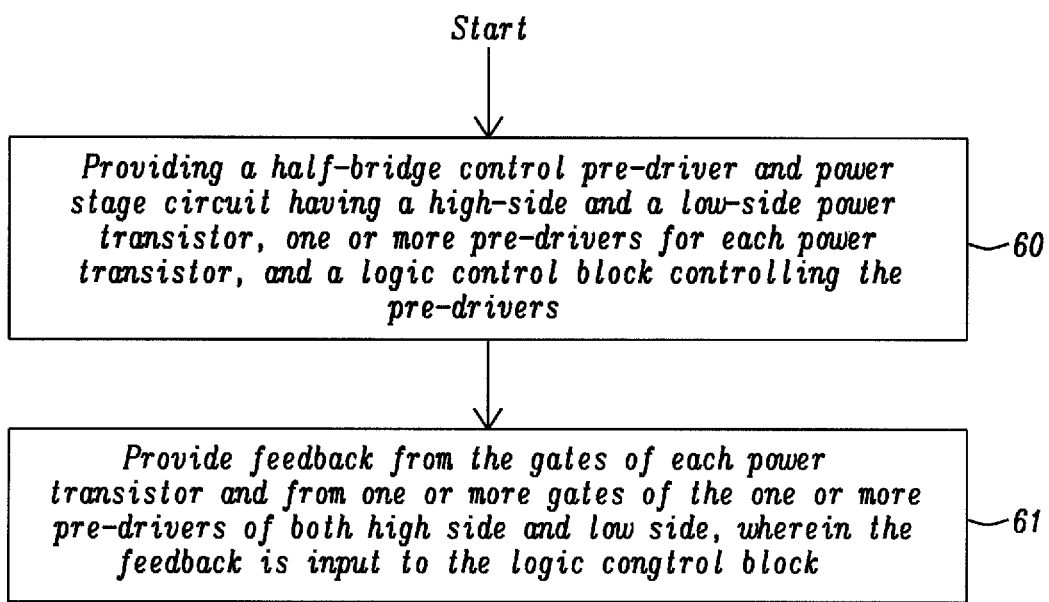

FIG. 6 illustrates a flowchart of a method to achieve an automatic and robust anti-shoot-through glitch-free operation of half-bridge control pre-driver and power stage circuits.

DETAILED DESCRIPTION

The present disclosure relates to gate drive control circuit, method and apparatus in a field of driver circuits for two series connected power devices/switches. Particularly, the present disclosure relates to circuits and methods that guarantee that only one power device/transistor is being enabled (i.e. conducting current) at a time preventing cross-conduction or "shoot-through" between power supplies.

Series connected power devices between two power rails as presented here are used in many applications: switching regulators, Class-D amplifiers, motor drivers etc. Such series connection of power devices/transistors is often referred to as half-bridge configuration.

Figure 1A:
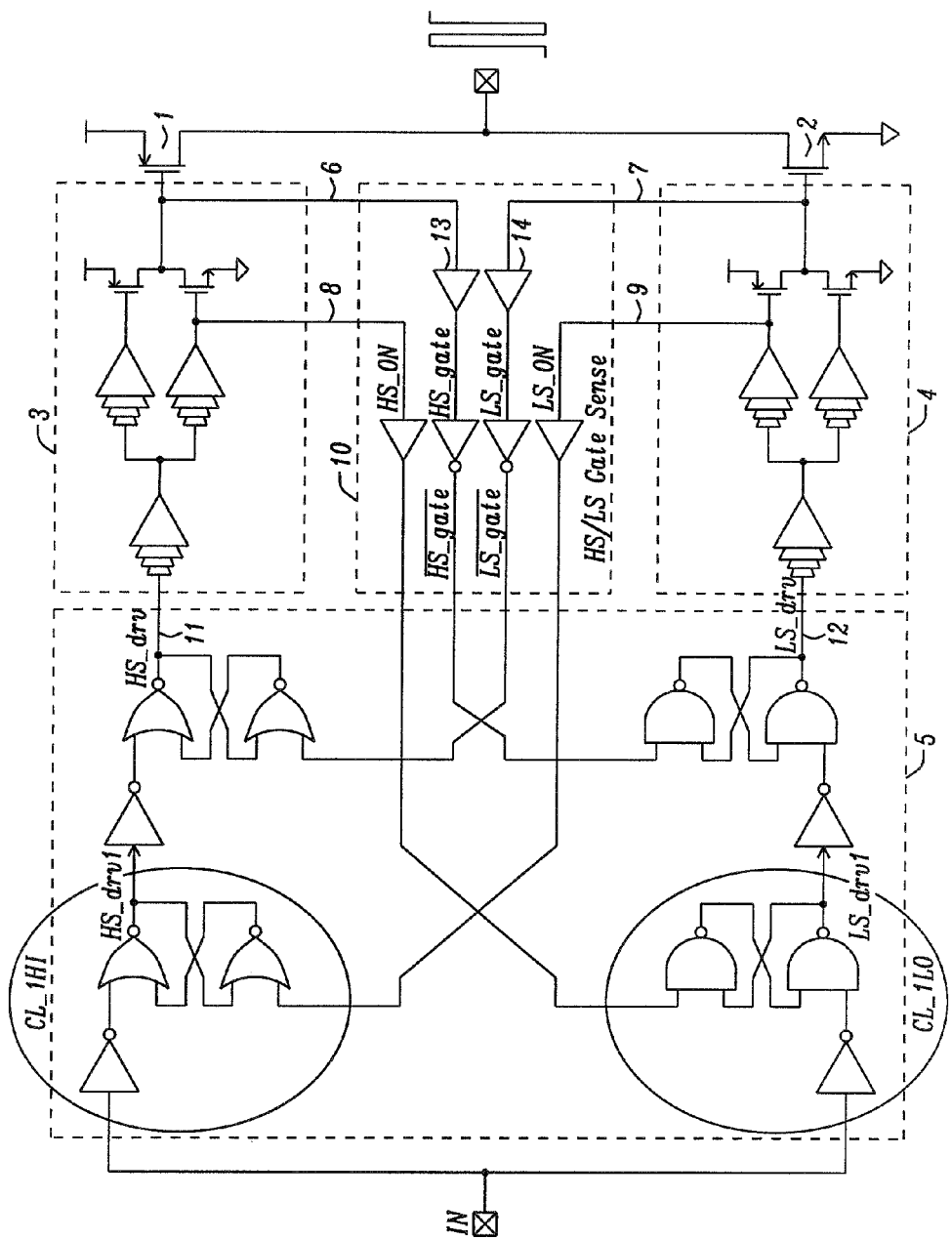
Figure 1B:
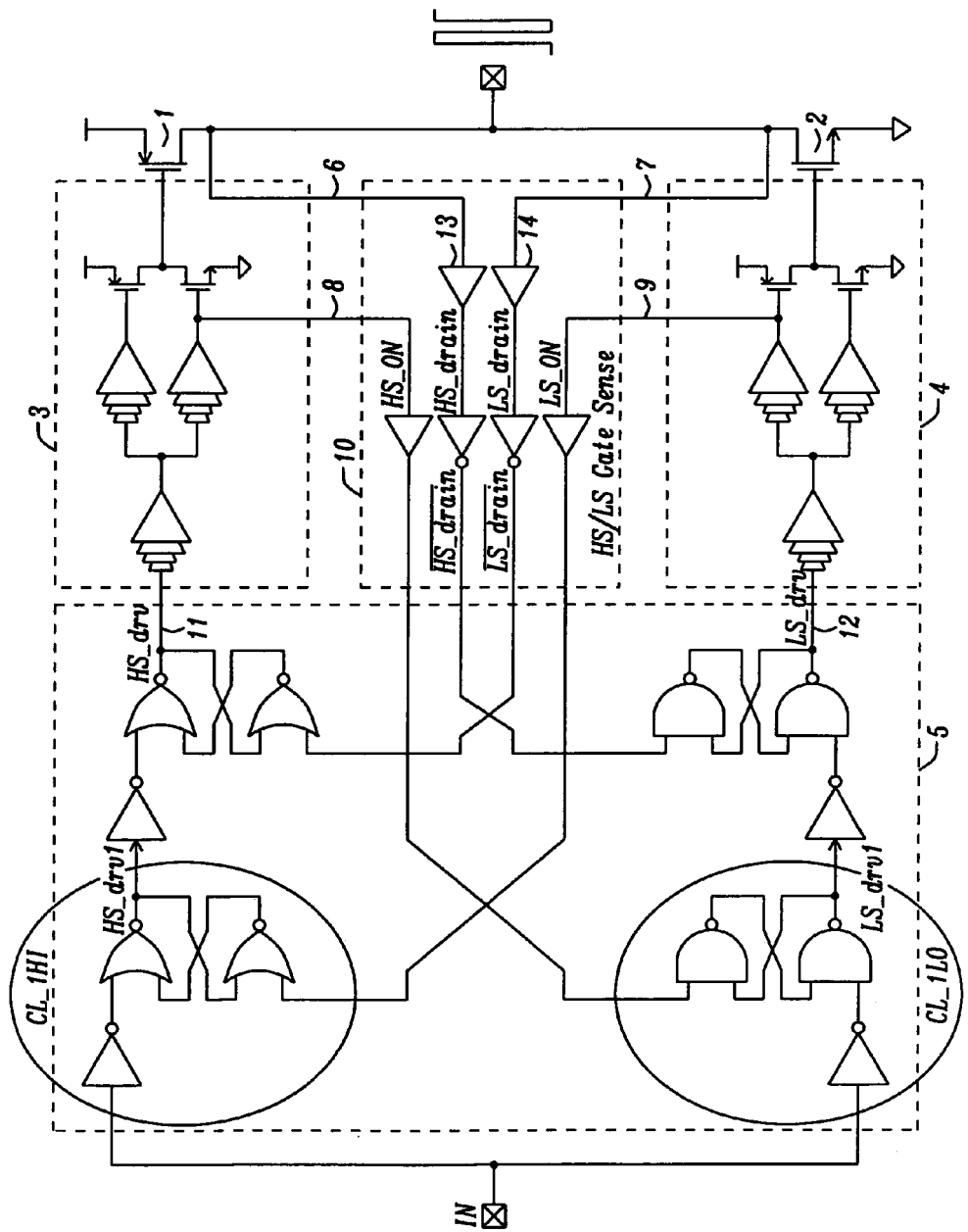

FIG. 1a shows a proposed simplified circuit block diagram of multiple feedback control gate drive. It should be noted that the two feedback loops for each high side and low side are a non-limiting example; more than two feedback loops on each side could be used as well. The high-side power transistor 1 and low-side power transistor 2 are driven by a high-side pre-driver circuit 3 and respectively by a low-side pre-driver circuit 4. These pre-drivers are controlled by a general control logic block 5 receiving an input signal IN at an input port, comprising on each high side and low side two logic blocks connected in series, wherein each of these logic control blocks has two input. A first of these two control logic blocks receives as input the system input signal IN and a feedback signal from a gate of an output transistor of the pre-driver 3 respective 9. A second of these two control logic blocks receives as input an output signal of the first logic control block and a feedback signal from the gate of the power transistor 1 respective 2. The general control block 5 provides an ON/OFF signal 11 to enable/disable the high-side power device 1. The general control block 5 provides also an ON/OFF signal 12 to enable/disable the low-side power device 2. FIG. 1b shows a similar circuit as FIG. 1a but the feedback of line 6 respective line 7 is not provided from a gate of the power transistors but from a drain of the power transistor The high-side gate signal 6 is buffered by buffer 13 and the low-side gate signal 7 is buffered by buffer 14.

Multiple feedback control signals which are taken both from gates of power devices and from a gate of a device that enables power device ON state comprise a signal 6 from the gate of the high-side power transistor 1, a signal 7 from the gate of the low-side power transistor 2, a signal 8 from the device enabling power device 1 ON state, and a signal 9 from the device enabling power device 2 ON state. As shown in FIG. 1b signals 6 and 7 may be alternatively be derived from the drain, instead from the gate of the respective power transistor 1 and 2. These feedback signals 6-9 are input to the general control logic block 5. The multiple feedback signals are summarized in the High side/Low side (HS/LS) block 10.

The logic control block 5 controls both high-side/low-side pre drivers 3 and 4 dependent on the input signals IN and the feedback signal 6-9. The logic control block 5 comprises an arrangement of inverters and NAND/NOR latches.

The logic block 5 comprises two groups of control logic components, CL_1HI and CL_1LO. Each control logic group CL_1HI and CL_1LO contains appropriate NAND/NOR RS latches to enable functionality. Both groups CL_1HI and CL_1LO support the exemplary circuit of FIG. 1 having multiple feedbacks, e.g. two feedbacks, namely from the power devices 1 and 2 and one additional feedback from each pre-driver 3 and 4, i.e. signals 8 respectively 9. In case more feedback lines are deployed, as outlined later in regard of FIGS. 5a and 5b, more control logic groups are required. If, for instance, two feedback lines are deployed from each pre-driver, then an additional group of control logic components is required, i.e. CL_1 plus CL_2 for each of both high side and low side.

The latches are used to hold signals of the state of pre-drivers 3 and 4 and to wait for confirmation that state may change based on the status of control in order to guarantee no occurrence of false triggering (glitching) or that the power device gates are enabled at the same time.

It should be noted that the disclosure is not limited to the arrangement of inverters and NAND/NOR latches shown specifically in FIG. 1. Alternative logic arrangements are possible as well.

It should be noted that any other type of control can be used as long as it performs the same functions as the latches described in detail.

As it will be shown below, the multiple feedback signals 6-9 together with a proper processing of these signals in the logic control block 5 guarantees glitch-free and robust operation. Furthermore enabling glitch-free operation reduces EMI and improves efficiency of the circuit also.

It has to be noted that the advantage of introducing multiple feedbacks is that when the control circuit receives the information that a certain gate pre-drive signal for e.g. a first power device has been commanded to be ON or OFF and, if this signal has been e.g. commanded to be ON, the control circuit should not try to enable the second power device.

For example, if the high-side driver signal HS_ON 8, shown in FIG. 1, is set HIGH (ON) the gate of the power PMOS device 1 is going to be driven LOW (enabled). However, if the time delay during which the gate of the power PMOS device 1 is getting enabled is too long, for example due to slow rise/fall time of the pre-driver, the control circuit 5 may release false trigger signals. Using multiple feedback signals from the pre-drivers provide correct status of the pre-driver 3 and 4 settings and prevent false trigger signals from the control circuit 5.

Figure 2:
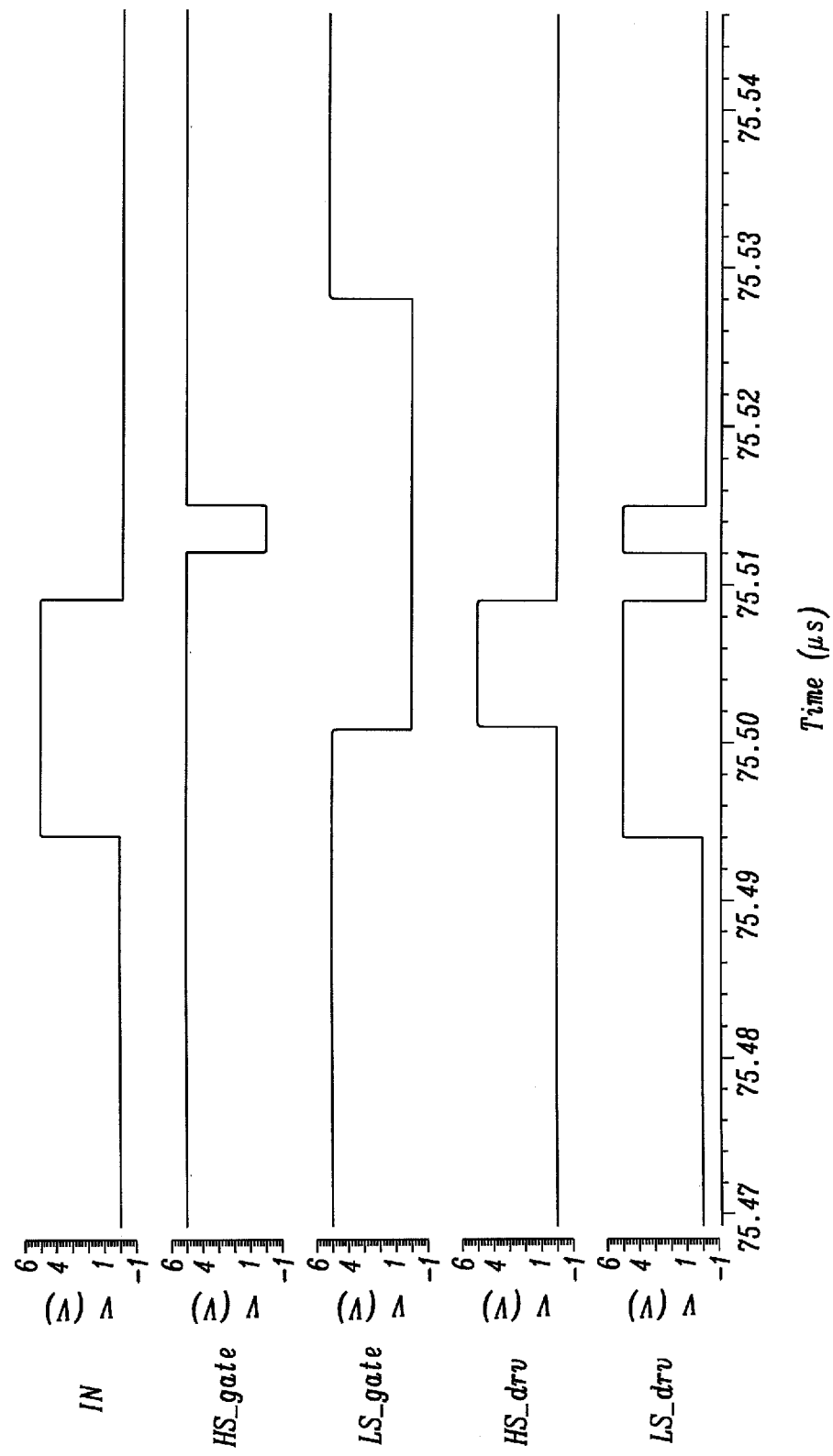

Simulation results comparing operation of the typical prior art circuit and present invention are shown in FIGS. 2-4a+b. FIG. 2 prior art demonstrates simulation results of a typical gate driver circuit. Typical prior art gate driver circuit have all gate driver signals for power devices and pre-driver input signals for both high-side and low-side. The prior art gate driver circuits have at most a feedback signal from the gates of the power devices. This kind of feedback was also used for the simulation used for FIG. 2 including also layout parasitics simulation.

FIG. 2 illustrates a glitch on a low side driver signal LS_drv signal. A glitch is produced when high-side driver pulse HS_drv pulse width becomes shorter than combined HS_drv pulse propagation time. In the given example the input signal pulse IN width is approximately 15 nSec, propagation delay of the rising edge of HS_drv signal is 12 nSec and pulse width of HS_drv signal is 9 nSec and glitch duration is about 3 nSec.

A "glitch" or unintended fast switch OFF (3 nSec duration) and switch ON (3 nSec duration) of the low side pre-driver circuit under certain conditions may potentially result in a damage of the low-side pre-driver circuit. In this particular example the pre-driver circuits was designed to operate at typical switching frequency of 1 MHz and a fast glitch with a period of 6 nSec will result in instantaneous frequency exceeding 100 MHz.

Figure 3:
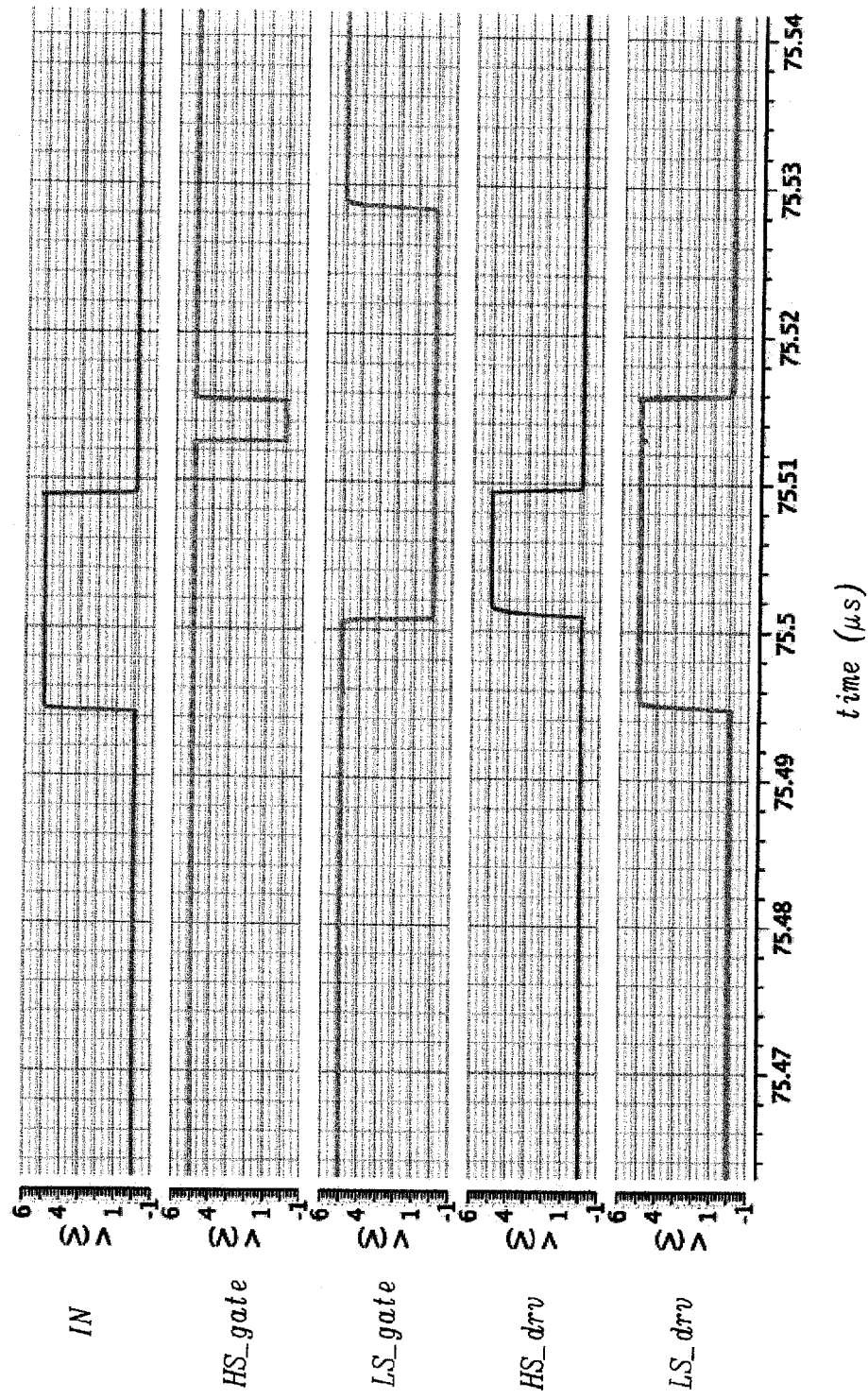
Figure 4A:
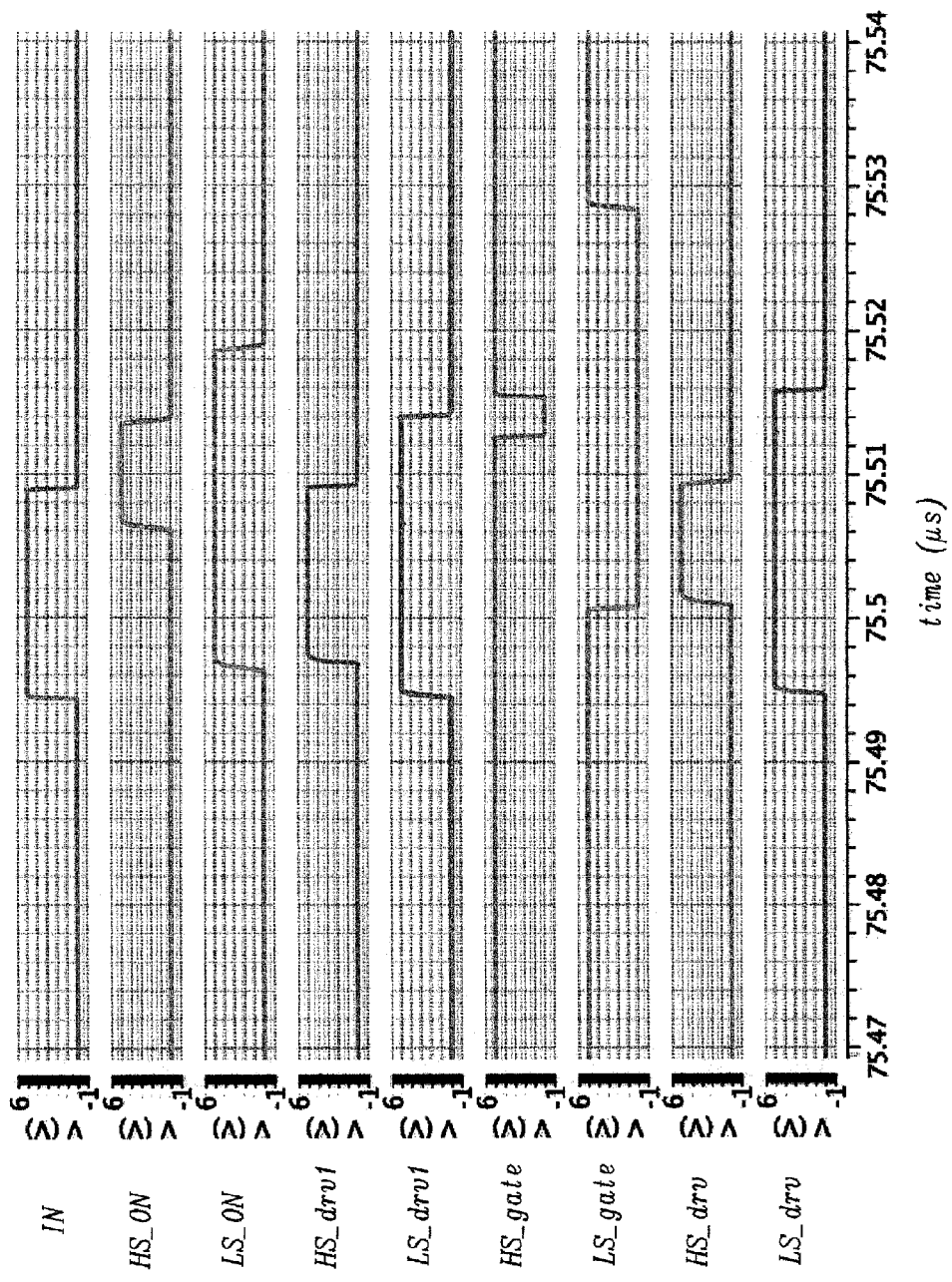
FIG. 4a depicts simulation results of the proposed circuit from FIG. 1a demonstrating all control signals

For comparison the exact same simulation has been performed on the circuit with the proposed method shown in FIG. 1. Simulation results of the circuit disclosed of FIG. 1 are shown in FIG. 3. It can be seen in FIG. 3 that under the same conditions (exact same rise/fall time of the pre-driver circuits, size of the output devices and layout parasitics) there is no glitch observed on the LS_drv signal. The given example only demonstrates glitch on the LS_drv signal of the typical prior art circuit; however a similar glitch caused by the same effect can also be demonstrated for HS_drv signal. FIG. 4a demonstrates same simulation results as in FIG. 3 but it also shows additional control signals present in the proposed circuit (i.e. HS_On case, LS_ON case, HS_drv1 case, and LS_drv1 case).

Figure 4B:
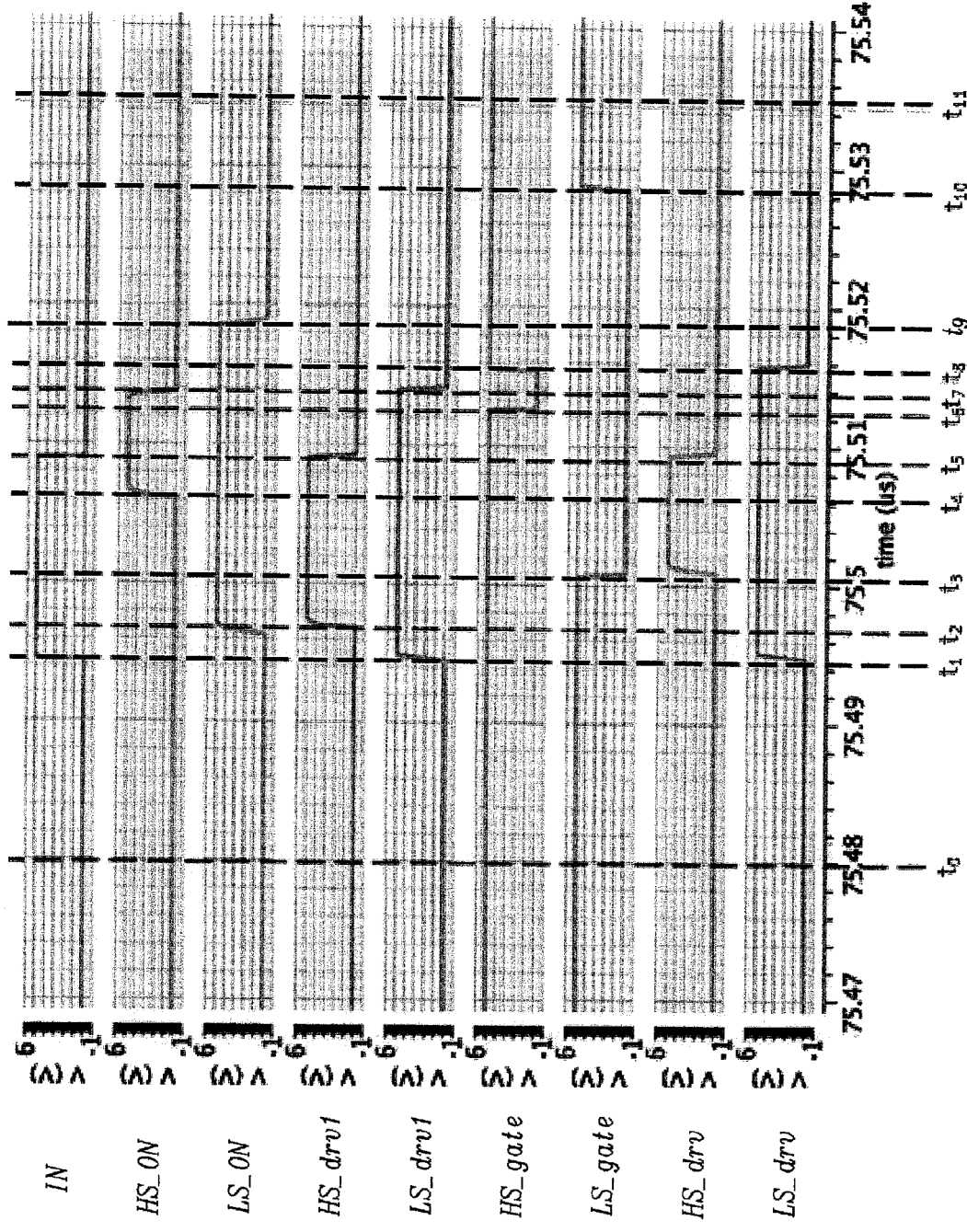
FIG. 4b shows simulation results of the proposed circuit from FIG. 1 demonstrating all control signals including timing events.

FIG. 4b shows simulation results of the proposed circuit from FIG. 1 demonstrating all control signals including timing events. FIG. 4a+b shows also the logic dependencies of the signals.

At time $t_0$ (In FIG. 4b at 75.48 μsec) the control circuit and signals are in a steady state, the input signal IN is low (IN=0). Corresponding logic states of all control signals can be written: IN=0, LS_drv1=0, HS_drv1=0, LS_drv=0, HS_drv=0, LS_ON=0, LS_gate=1, HS_ON=0, HS_gate=1. In this state the low side (N) power device is active and conducting current. At time $t_1$ a rising edge has been applied to the input signal commanding state change and the control circuit starts to change its state to enable HS power device (P-side) 1 conduction.

On a rising edge of the input signal at time $t_1$ first LS_drv1 and after a short delay LS_drv signals will change their states from 0 to 1 commanding LS pre-driver 4 to switch-off LS power device 2 at time $t_2$. LS_ON=1 and also changing state of HS_drv1=1 allowing to start turn-on of the HS power device 1. After some delay (rise/fall time delay) defined by propagation delay at time $t_3$ buffered gate control signal changes state LS_gate=0 and it allows trigger changes of state of HS_drv=1. Between time $t_1$ and $t_2$ HS_drv1 was holding its state waiting for feedback signal confirming that LS_ON has been disabled and HS_drv signal in its turn is holding its state between time $t_2$ and $t_3$. Setting LS_gate to low state confirms the LS power device 2 is switched off.

After some propagation delay at time $t_4$ HS_ON changes its state to HS_On=1(ON) starting to turn on the gate of HS power device 1: The HS_gate has finished turning on after HS_gate=0 buffered confirmation signal is set at time $t_6$. At time $t_6$ the HS power device 1 is turned on (active) and conducting current. However, in this example before HS power device 1 has been enabled (due to propagation delays and rise/fall time delays) at time $t_5$ the input signal changes its state from high to low IN=0, commanding control circuit to change states from high side (HS) being active to low side (LS) being active. This transition of the input signal starts reverse process, initially disabling HS power device 1 and enabling LS power device 2. Such a condition most certainly would cause glitches in prior art circuits as illustrated in FIG. 2 prior art.

After input state changes from "1" to "0" at time $t_5$ first HS_drv1 and after a short delay HS_drv change their states from 1 to 0 and after short delay at time $t_7$ HS_ON changes its state from 1 to 0 commanding gate of HS power device 1 to power off and also allowing LS_drv1=0 to transition low. At time $t_8$ HS_gate signal transitions from low to high state also allowing LS_drv to change its state to 0, confirming switched off state of HS power device 1 and sending confirmation signal to enable LS power device 2. Between time $t_5$ and $t_7$ LS_drv1 was holding its state waiting for signal confirming that HS_ON has been disabled and LS_drv signal is respectively holding its state between time $t_7$ and $t_8$. After some delay at time $t_9$ LS_ON transitions to low and after some delay (rise/fall time delay) at time $t_{10}$ gate LS_gate signal transitions to high confirming that the gate of LS power device 2 is enabled. At time $t_{11}$ the circuit returns in its original state ($t_0$) waiting for any further change of the input signal.

It can be also observed from FIG. 4b (HS_gate and LS_gate) that "dead time" occurs when both power device are disabled is from time $t_3$ to $t_6$ and from $t_8$ to $t_{10}$.

It is important to understand that the circuit of the present disclosure operates very robust because the latches used are waiting for confirmation of incoming feedback signals.

Other techniques, leading to various design and performance trade-offs, can effectively be used to protect pre-driver circuits from the effects of such glitches. For example, external minimum duty cycle limiters can be used to limit minimum pulse-width of the input signal. Such approach however may not be desirable in some applications where the duty cycle limitation is not desirable. Another alternative for guaranteeing glitch-free operation is a tight control over rise/fall times (generally increase speed of r/f times), careful layout of the pre-driver circuits and entire half-bridge circuit. However such measures may not be feasible due to various practical reasons (technologies scaling limitation, physical block location on-chip, presence of level-shifting between control circuits, pre-drivers and/or output/input control signals). The present disclosure however does not require extensive care or any post-layout simulations of parasitic impact to guarantee glitch-free operation of the circuit.

Only two feedback loops are demonstrated by the circuit shown in FIG. 1, generally however more than two feedback loops can be established using exact principle described in this disclosure. Feedback control can be cascaded to enable higher order feedback control for highly distributed gate driver circuits.

The concept of multiple feedback control loops is shown in FIG. 5a. It shows the general principle for cascading N-order control feedback and drivers, high and low side respectively. This figure illustrates that not only two but more than two feedback loops can be used in case there is need for that. FIG. 5a generalizes the principle that is shown in FIG. 1 to use more than one feedback for each high-side and low-side. In the exemplary case of the circuit of FIG. 1 one control logic group CL_1HI and CL_1LO was deployed for each high side and low side; correspondently to deploying one additional feedback line from each pre-driver. FIG. 5a illustrates the general principle of the present disclosure, deploying N pre-driver feedback lines with N control logic groups for each high and low sides, CL_1HI to CL_NHI, respectively CL_1LO to CL_NLO with N driver logic groups DR_1 to DR_N for each high-sides (HI) and low side (LO) as already indicated in FIG. 1. The same latches, e.g. NAND/NOR RS latches, with appropriate inverters as shown in FIG. 1, are used in these control logic groups CL_1HI/LO to CL_NHI/LO, shown in FIG. 5a. FIG. 5b illustrates the general principle of the disclosure showing cascading of multi-feedback control logic loops, high and low side respectively, (where CL_1 . . . N—control logic 1 to N, DR_1 . . . N—Driver logic 1 to N) and shows an alternative exemplary implementation wherein the number of control blocks is lower than the number n of pre-drivers, e.g. the control blocks controlled by pre-drivers DR_1 have been removed. As indicated by dashed lines in FIGS. 5a and 5b the signals derived from the gates of the power transistors 1 and 2 could be alternatively be replaced by signals from the sources or the drains of the power transistors 1 and 2.

It should be noted that alternatively the number of logic blocks might be less than the number n of pre-drivers, this means that the number of logic control blocks is higher or equal to two, but less the number n of the pre-drivers. 2. This is also shown in FIG. 1, there is a number of pre-drivers from which there is no feedback connection indicated.

Furthermore it should be noted that feedback from the pre-drivers to the logic blocks may be alternatively provided not only from the gates of the pre-drivers but also, depending on arrangement of the pre-drivers, from sources or drains of the pre-drivers. Other alternatives are to obtain feedback from the source or drain of power devices 1 and 2. Feedback from the gates of the pre-drivers and power devices may be a preferred embodiment of the circuit.

FIG. 6 illustrates a flowchart of a method to achieve an automatic and robust anti-shoot-through glitch-free operation of half-bridge control pre-driver and power stage circuits. A first step 60 describes the provision of a half-bridge control pre-driver and power stage circuit having a high-side and a low-side power transistor, one or more pre-drivers for each power transistor, and a logic control block controlling the pre-drivers. Step 61 shows providing feedback from the gates of each power transistor and from one or more gates of the one or more pre-drivers of both high side and low side, wherein the feedback is input to the logic control block.

What is claimed is:

1. A system capable of an automatic and robust anti-shoot-through glitch-free operation of half-bridge control pre-driver and power stage circuits using at least two feedback loops from each branch of the half-bridge, comprising:
    one input port receiving an input signal;
    one output port;
    a high-side branch and a low-side branch arranged in parallel, wherein both branches are connected to the input port, each branch comprising:
        a power transistor having a gate controlled by n pre-drivers connected in series, wherein n is an integer number equal or higher than 2;
        said n pre-drivers driving the power transistor of the correspondent branch; and
        a number of logic control blocks connected in series enabling to switch to ON state or to switch to OFF state of the power transistor of the correspondent branch via the n pre-drivers of the correspondent branch wherein a first of the number of logic control blocks is connected to the input port and a last logic control block is connected to a first of the n pre-drivers, and wherein the logic blocks comprise either logical NOT AND (NAND) logic gates or NOT OR (NOR) logic gates;
    wherein both power transistors are connected in series between VDD voltage and ground, wherein a source of the high side power transistor is connected to VDD voltage, a drain of the high side power transistor is connected to a drain of the low side power transistor, the source of the low side power transistor is connected to ground, wherein the drains of both power transistors are connected to the output port, wherein only the drains of the power transistors provide input to the output port, and wherein two or more feedback loops from each branch are implemented from each branch to the logic control blocks of the opposite branch in order to be capable of preventing cross-conduction between both power transistors of the low side and of the high side.

2. The system of claim 1, wherein each of the logic control blocks of the low side comprises a reset/set (RS) latch built of logical NOT AND (NAND) logic gates and each logic control block of the high side comprises a reset/set (RS) latch built of logical NOT OR (NOR) logic gates.

3. The system of claim 1, wherein each logic control block of the high side is configured to receive a feedback signal from an output of an assigned pre-driver of the low side, wherein each logic control block of the high side is exclusively assigned to one correspondent pre-driver of the low side, wherein alternatively instead of a feedback signal from the output of the pre-driver, which is directly connected to the low side power transistor, the feedback signal may be generated from a drain of the low side power transistor, and the system is capable of enabling to switch to ON state or to switch to OFF state of the high side power transistor via the n pre-drivers of the high side and wherein each logic control block of the low side is configured to receive a correspondent feedback signal from an output of an assigned pre-driver of the high side, wherein each control block of the low side is exclusively assigned to one correspondent pre-driver of the high side, wherein alternatively instead of a feedback signal from the output of the pre-driver, which is directly connected to the low side power transistor, the feedback signal may be generated from a drain of the low side power transistor, and the system is capable of enabling to switch ON state or to switch to OFF state of the low side power transistor via the n pre-drivers of the low side in order to prevent cross-conduction between both power transistors of the low side and of the high side.

4. The system of claim 1, wherein the number of logic control block is equal to the number n of the pre-drivers, wherein the gate or the drain of the power transistor of the high side is connected to a first low side logic control block that is the closest to the n low side pre-drivers connected in series, wherein the gate or the drain of the power transistor of the low side is connected to a first high side logic control block that is the closest to the n high side pre-drivers connected in series, and wherein each logic control block of the high side is exclusively assigned to one correspondent pre-driver of the low side.

5. A system capable of an automatic and robust anti-shoot-through glitch-free operation of half-bridge control pre-driver and power stage circuits using at least two feedback loops from each branch of the half-bridge, wherein each branch comprises two logic control blocks and one pre-driver, comprising:
  one input port receiving an input signal;
  one output port;
  a high-side branch and a low-side branch arranged in parallel, wherein both branches are connected to the input port, each branch comprising:
    a power transistor having a gate controlled by the pre-driver;
    said pre-driver configured to driving the power transistor of the correspondent branch and capable of enabling to switch to ON state or to switch to OFF state of the power transistor; and
    two logic control blocks enabling to switch to ON state or to switch to OFF state of the power transistor of the correspondent branch via the pre-driver of the correspondent branch, wherein a first input of a first logic control block is connected to the input port of the system and a second input of the first logic control block is connected via only a gate sense unit to a gate of an output transistor of the pre-driver of the opposite branch and wherein a first input of a second logic control block is connected to an output of the first logic control block and a second input of the second control logic block is connected via only a buffer and a gate sense unit to a gate or to a drain of the power transistor of the opposite branch and wherein an output of the second logic control block is connected to an input of the pre-driver, and wherein the logic blocks comprise either logical NOT AND (NAND) logic gates or NOT OR (NOR) logic gates;
  wherein both power transistors are connected in series between VDD voltage and ground, wherein a source of the high side power transistor is connected to VDD voltage, a drain of the high side power transistor is connected to a drain of the low side power transistor, the source of the low side power transistor is connected to ground, wherein the drains of both power transistors are connected to the output port, and wherein two or more feedback loops are implemented from each branch to the logic control blocks of the opposite branch in order to be capable of preventing cross-conduction between both power transistors of the low side and of the high side.

6. The system of claim 5, wherein each logic control block of the low side comprises a SR latch built of NAND logic gates and wherein each logic control block of the high side comprises a SR latch built of NOR logic gates.

7. The system of claim 5, wherein each of the logic control blocks of the low side comprises a reset/set (RS) latch built of NOT AND (NAND) logic gates and each of the logic control blocks of the high side comprises a reset/set (RS) latches built of NOR logic gates.

8. A method to achieve an automatic and robust anti-shoot-through glitch-free operation of half-bridge control pre-driver and power stage circuits using at least two feedback loops from each branch of the half-bridge, the method comprising the steps of:
  (1) providing a half-bridge control pre-driver and power stage circuit having a high-side branch and a low-side branch, wherein each branch comprises a power transistor, n pre-drivers, connected in series, driving the power transistor of the respective branch and capable of enabling to switch to ON state or to switch to OFF state of the respective power transistor, and at least two logic control blocks, connected in series in a consecutive row, wherein an output of a previous logic block is an input of a following logic block, controlling the n pre-drivers, wherein n is an integer number equal or higher than 1 and wherein the logic blocks comprise either logical NOT AND (NAND) logic gates or NOT OR (NOR) logic gates; and
  (2) using feedback from the gate or drain of each power transistor and from gates of output transistors of each of the one or more pre-drivers or from outputs of the one or more pre-drivers of each of both high side and low side, wherein at least two feedback loops from each branch of the half-bridge are implemented, wherein each feedback is input to an exclusively assigned logic control block enabling to switch to ON state or to switch to OFF state of each power transistor via the n pre-drivers in order to prevent cross-conduction between the power transistor, wherein each logic control block of the high side is exclusively assigned to one correspondent pre-driver of the low side and each control block of the low side is exclusively assigned to one correspondent pre-driver of the high side enabling to switch to ON state or to switch to OFF each correspondent power transistor via the n pre-drivers in order to prevent cross-conduction between the power transistor, wherein each of the logic control blocks of the low side comprises a reset/set (RS) latch built of NOT AND (NAND) logic gates and each of the logic control blocks of the high side comprises a reset/set (RS) latch built of NOT OR (NOR) logic gates.

9. The method of claim 8, wherein the number of logic control block is equal to the number n of the pre-drivers, wherein n is equal to 2 or higher, wherein the gate or drain of the power transistor of the high side is connected to an input of a nth low side logic control block, which is the closest to the n low side pre-drivers, wherein a gate or an output terminal of an output transistor of a (n−1)th high side pre-driver, which is directly connected to an input of an nth pre-driver of the high side being directly connected to the gate of the high side power transistor, is connected to an input of a (n−1)th low side logic control block, which is directly connected to the nth low side logic control block, wherein the gate or drain of the power transistor of the low side is connected to an input of a nth high side logic control block, which is the closest to the n high side pre-drivers, wherein a gate or an output terminal of an output transistor of a (n−1)th low side pre-driver, which is directly connected to an input of an nth pre-driver of the low side being directly connected to the gate of the low side power transistor, is connected to an input of a (n−1)th high side logic control block which is directly connected to the nth high side logic control block.

10. The method of claim 8, wherein the number n of the pre-drivers equals 1 and the number of logic control blocks of each branch equals 2, wherein the gate or drain of the power transistor of the high side is connected to a second input of a second logic control block of the low side, wherein an output of the second logic control block of the low side is connected directly to an input of the pre-driver of the low side, wherein a first input of the second logic block of the low side is connected to an output of the first logic control block of the low side, wherein a gate or an output terminal of an output transistor of the pre-driver of the high-side is connected to a second input of a first logic control block of the low side, wherein a first input of the first logic block of the low side is connected to the input port of the system, wherein the second logic control block of the low side is configured to processing the second input from the power transistor of the high side and to receiving and processing the output signal from the first logic control block of the low side and to provide an output signal to the pre-driver of the low side, wherein the gate or drain of the power transistor of the low side is connected to a second input of a second logic control block of the high side, wherein an output of the second logic control block of the high side is connected directly to an input of the pre-driver of the high side, wherein a first input of the second logic block of the high side is connected to an output of the first logic control block of the high side, wherein a gate or an output terminal of an output transistor of the pre-driver of the low-side is connected to a second input of a first logic control block of the high side, wherein a first input of the first logic block of the high side is connected to the input port of the system, wherein the second logic control block of the high side is configured to processing the second input from the power transistor of the low side and to receiving and processing the output signal from the first logic control block of the high side and to provide an output signal to the pre-driver of the high side.

11. The method of claim 10, wherein the logic control blocks of the low side comprise each a SR latch built of NAND logic gates and wherein the logic control blocks of the high side comprise each a SR latch built of NOR logic gates.

* * * * *